(12) United States Patent
Joshi et al.

(10) Patent No.: US 9,773,736 B2
(45) Date of Patent: Sep. 26, 2017

(54) INTERMEDIATE LAYER FOR COPPER STRUCTURING AND METHODS OF FORMATION THEREOF

(71) Applicant: Infineon Technologies AG, Neubiberg (DE)

(72) Inventors: Ravi Keshav Joshi, Villach (AT); Juergen Steinbrenner, Noetsch (AT); Christian Fachmann, Fuernitz (AT); Petra Fischer, Wernberg (AT); Roman Roth, Sattfendorf (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/607,708

(22) Filed: Jan. 28, 2015

(65) Prior Publication Data

US 2016/0218033 A1    Jul. 28, 2016

(51) Int. Cl.
*H01L 23/532* (2006.01)
*H01L 21/768* (2006.01)
*H01L 23/00* (2006.01)
*H01L 21/3213* (2006.01)

(52) U.S. Cl.
CPC .. *H01L 23/53238* (2013.01); *H01L 21/32134* (2013.01); *H01L 21/76885* (2013.01); *H01L 24/00* (2013.01); *H01L 21/32139* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 4,393,096 A | * | 7/1983 | Gajda | H01L 21/32051 204/192.32 |
| 6,376,375 B1 | * | 4/2002 | Hewitt-Bell | H01L 21/76838 257/E21.582 |
| 6,720,243 B2 | * | 4/2004 | Weng | H01L 24/11 257/E21.508 |
| 2003/0134496 A1 | * | 7/2003 | Lee | H01L 23/3114 438/612 |
| 2004/0113273 A1 | * | 6/2004 | Chen | H01L 24/05 257/737 |
| 2006/0267198 A1 | * | 11/2006 | Lin | H01L 23/5283 257/750 |
| 2007/0205520 A1 | * | 9/2007 | Chou | H01L 23/3157 257/780 |
| 2013/0228929 A1 | * | 9/2013 | Meinhold | H01L 21/7685 257/762 |

* cited by examiner

*Primary Examiner* — Andres Munoz
(74) *Attorney, Agent, or Firm* — Slater Matsil, LLP

(57) ABSTRACT

A method of forming a metallization layer over a semiconductor substrate includes depositing a blanket layer of a diffusion barrier liner over an inter level dielectric layer, and depositing a blanket layer of an intermediate layer over the diffusion barrier liner. A blanket layer of a power metal layer including copper is deposited over the intermediate layer. The intermediate layer includes a solid solution of a majority element and copper. The intermediate layer has a different etch selectivity from the power metal layer. After depositing the power metal layer, structuring the power metal layer, the intermediate layer, and the diffusion barrier liner.

21 Claims, 12 Drawing Sheets

INTERMEDIATE LAYER FOR COPPER STRUCTURING AND METHODS OF FORMATION THEREOF

TECHNICAL FIELD

The present invention relates generally to copper metallization, and, in particular embodiments, to an intermediate layer for copper structuring and methods of formation thereof.

BACKGROUND

Semiconductor devices are used in a variety of electronic and other applications. Semiconductor devices comprise, among other things, integrated circuits or discrete devices that are formed on semiconductor wafers by depositing one or more types of thin films of material over the semiconductor wafers, and patterning the thin films of material to form the integrated circuits.

After fabricating various devices within a semiconductor substrate, these devices are interconnected through metal interconnects. Metal interconnects are formed over the device regions and are formed in multiple layers or levels called metallization levels. Metal interconnects were made of aluminum in traditional processes.

Technology scaling has required aggressively reducing the thicknesses of the metal interconnects in the lower metallization levels. The reduced thicknesses resulted in increased resistances of these metal lines. As a consequence, lower levels of metallization have been replaced by copper, which has a lower resistance. However, the uppermost level of metallization in conventional devices is made of aluminum. This is due to the complexity of integrating copper into the uppermost metallization level, which requires thick metal lines.

SUMMARY

In accordance with an embodiment of the present invention, a method of forming a metallization layer over a semiconductor substrate comprises depositing a blanket layer of a diffusion barrier liner over an inter level dielectric layer, and depositing a blanket layer of an intermediate layer over the diffusion barrier liner. A blanket layer of a power metal layer comprising copper is deposited over the intermediate layer. The intermediate layer comprises a solid solution of a majority element and copper. The intermediate layer has a different etch selectivity from the power metal layer. After depositing the power metal layer, structuring the power metal layer, the intermediate layer, and the diffusion barrier liner.

In accordance with another embodiment of the present invention, a method of forming a metallization layer over a semiconductor substrate includes providing a wafer comprising a layer stack comprising a diffusion barrier liner, an intermediate layer comprising aluminum, and a metal layer comprising copper. Using wet chemical etching, a metal line is formed by etching the metal layer, the intermediate layer, and the diffusion barrier liner.

In accordance with another embodiment of the present invention, a method of forming a metallization layer over a semiconductor substrate includes forming a layer stack comprising a diffusion barrier liner, an intermediate layer, and a power metal layer comprising copper. A metal line is formed by etching the power metal layer and the intermediate layer continuously using a same wet chemical etching process. The wet chemical etching is selective between the intermediate layer and the power metal layer. The diffusion barrier layer is a diffusion barrier to copper atoms from the power metal layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
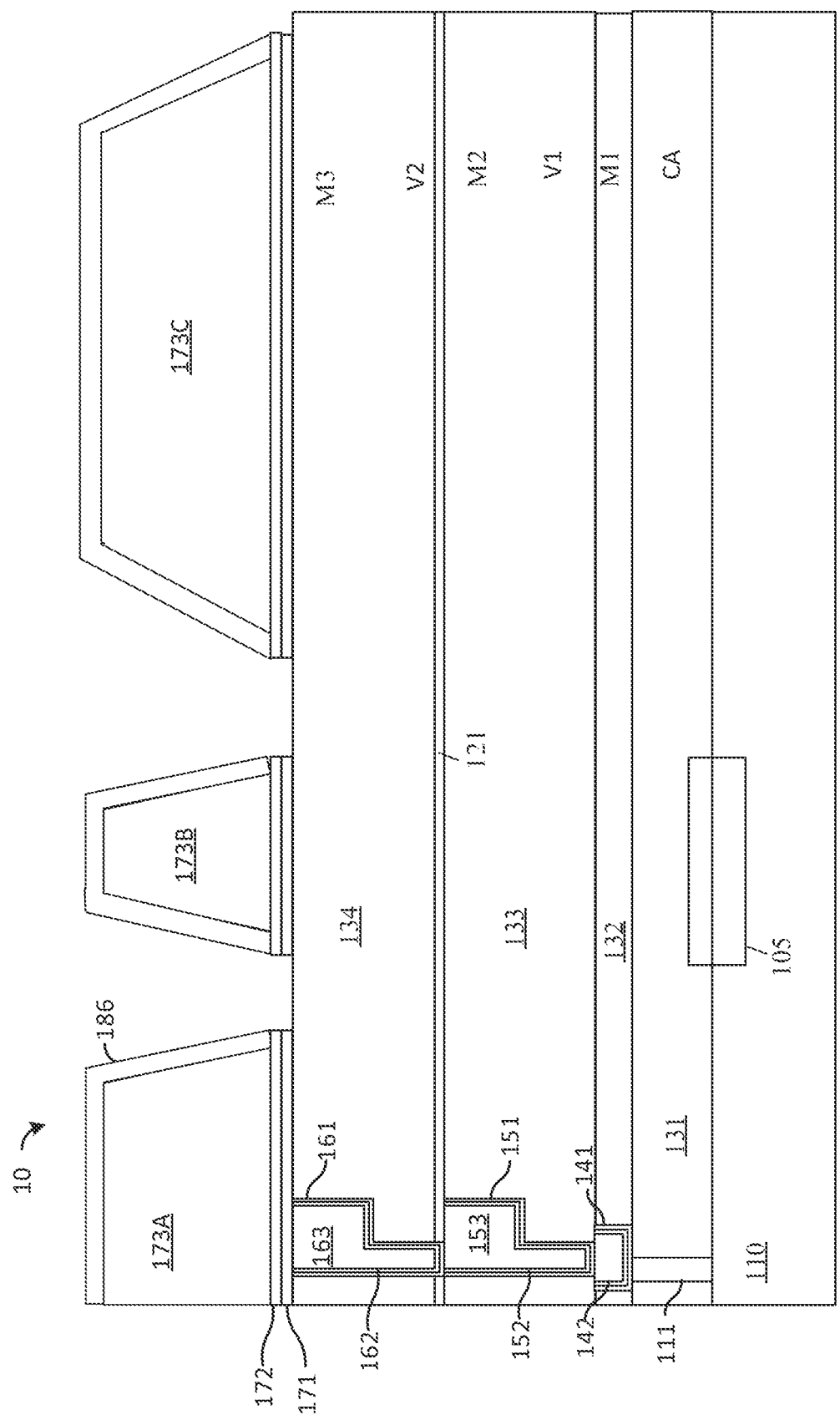
FIG. 1 illustrates a cross-sectional view of a semiconductor chip in accordance with an embodiment of the present invention.

The present invention will be described with respect to various embodiments in a specific context, namely etching of metal stack after copper electrochemical deposition. The invention may also be applied, however, to other instances when thick layers of metal or other materials have to be removed without harming adjacent structures. Similarly, embodiments of the invention may be applied to other processes such as wafer level processes for forming redistribution lines, which connect adjacent circuitry in a system on chip device.

By continuously shrinking the physical dimensions of the integrated circuit chip, performance enhancement, energy efficiency, reduction in the production cost etc. is achieved. Although chip performs efficiently, dissipation of the thermal energy is still a challenge. The major reason for this is the enormous increase in the current per unit area of the chip.

In conventional devices, the uppermost metal lines are made of aluminum. Therefore, metals such as copper are beginning to be used in power metals (uppermost metal layers, where the current density is highest). However, there are major problems associated with forming the thick structured copper. This is because unlike aluminum, copper cannot be etched using plasma etching techniques. This complexity is magnified because to the thick metal lines needed for the uppermost metal lines have to be fabricated with thick metal lines, for example, greater than about 5 µm.

Various techniques used in copper structuring have many challenges. For example, thick copper lines may be deposited between structured (patterned) resist lines. However, this requires long times for the copper deposition and subsequent stripping of the photo resist layers. In particular, forming thick copper lines requires the deposition of thicker resist layer because the resist layer has to be thicker than the copper lines. Subsequently, after forming the copper lines, these thick photo resist layers have to be stripped residual free without damaging the adjacent exposed copper lines and seed layer. Further, forming a planar surface is problematic as copper deposition rates vary depending on the size of the aperture in the photo resist resulting in the formation of copper lines of varying thicknesses.

Traditional anisotropic etching methods such as reactive ion etching can be used for etching copper. Therefore, alternatively, copper has to be deposited and then structured using wet chemical etching techniques. However, there is no good anisotropic wet etching chemistry for copper etching. Consequently, wet etching removes coppers both vertically and laterally at uneven rates depending on the openings in the resist layer (etch mask). For example, wet chemical etching of the thick copper layers (~3 to 10 µm) using conventional copper etching chemistry can form high lateral undercuts (etching of copper laterally), mouse bites (rough sidewalls due to uneven lateral etching) and other effects which increases the line roughness and makes it difficult to create small structures.

The root cause of the mousebite is not well understood. To avoid these problems different etch stop material liners such as tantalum, tantalum nitride, titanium are used between the diffusion barrier and the copper. However, all of these etch stops suffer certain disadvantages. In various embodiments, the present invention overcomes these and other limitations by using a layer comprising aluminum as an etch stop between the copper barrier layer and thick copper.

In one illustrative embodiment, the disclosure teaches the use of an intermediate layer between a power metal (copper) and a barrier layer, (e.g., comprising titanium tungsten) to enable structuring of the power metal using wet chemical etching. Conventionally, a power metal made of copper cannot be very well structured if it is deposited directly contacting the metal barrier. In addition, there is a serious issue of adhesion between the metal barrier and the power metal. The inventors of the present disclosure have found that wet chemical etching leads to high under etching as well as inhomogeneous or irregular etch profile of the power metal. The inventors of the present disclosure have found that this unexpected result can be eliminated when an intermediate layer is introduced. The presence of the intermediate layer dramatically improves the etch profile of the power metal after being structured using a wet chemical etching. An additional intermediate layer comprising aluminum between the power metal comprising copper and the barrier layer comprising TiW leads to a homogeneous etching of the power metal and control over the etching thereby resulting is uniform profile of the power metal after the wet chemical etching.

FIG. 1 illustrates a cross-sectional view of a semiconductor chip in accordance with an embodiment of the present invention.

The semiconductor chip 10 (not shown to scale) contains active circuitry disposed inside it. The active circuitry may be formed in and/or over a substrate 110 and includes the active device regions 105 and includes necessary transistors, resistors, capacitors, inductors or other components used to form integrated circuits. For example, active areas that include transistors (e.g., CMOS transistors) can be separated from one another by isolation regions, e.g., shallow trench isolation. In various embodiments, the semiconductor chip 10 may be formed on a silicon substrate 110. Alternatively, in other embodiments, the semiconductor chip 10 may have been formed on silicon carbide (SiC). In one embodiment, the semiconductor chip 10 may have been formed at least partially on gallium nitride (GaN). For example, the semiconductor chip 10 may be a lateral transistor formed on GaN on silicon. In another embodiment, the semiconductor chip 10 may be a vertical transistor formed on GaN on bulk GaN substrate. In alternative embodiments, the substrate 110 may comprise semiconductor on insulator substrates such as SOI as well as compound semiconductors such as GaAs, InP, InSb, SbInP, and others.

The substrate 110 may include epitaxial layers including heteroepitaxial or homoepitaxial layers. Some examples of the substrate 110 are a bulk mono-crystalline silicon substrate (or a layer grown thereon or otherwise formed therein), a layer of (110) silicon on a (100) silicon wafer, a layer of a silicon-on-insulator (SOI) wafer, or a layer of a germanium-on-insulator (GeOI) wafer. In other embodiments, other semiconductors such as silicon germanium, germanium, gallium arsenide, indium arsenide, indium gallium arsenide, indium antimonide, or others can be used as the substrate 110.

Next, metallization is disposed over the active device regions 105 to electrically contact and interconnect the active devices. The metallization and active device regions 105 together form a completed functional integrated circuit. In other words, the electrical functions of the chip 10 can be performed by the interconnected active circuitry. In logic devices, the metallization may include many layers, e.g., nine or more, of copper or alternatively of other metals. In memory devices, such as DRAMs, the number of metal levels may be less and may be aluminum.

The illustration in FIG. 1 shows two metal levels of metallization, which comprises a contact layer CA, first metal level M1, a first via level V1, second metal level M2, a second via level V2, and a third metal level M3. Referring to FIG. 1, a first insulating layer 131 is disposed over the substrate 110. The first insulating layer 131 may comprise a etch stop layer in one or more embodiments.

The first insulating layer 131 comprises $SiO_2$ such (deposited using) as tetra ethyl oxysilane (TEOS) or fluorinated TEOS (FTEOS), but in various embodiments may comprise insulating materials typically used in semiconductor manufacturing for inter-level dielectric (ILD) layers, such as doped glass (BPSG, PSG, BSG), organo silicate glass (OSG), carbon doped oxides (CDO), fluorinated silicate glass (FSG), spin-on glass (SOG), or low-k insulating materials, e.g., having a dielectric constant of about 4 or less, or dielectric diffusion barrier layers or etchstop layers such as silicon nitride (SiN), silicon oxynitride (SiON), silicon carbide (SiC) or silicon carbo nitride (SiCN), e.g., having a dielectric constant of about 4 or higher or combinations or multiple layers thereof, as examples, although alternatively, the insulating material layer 131 may comprise other materials. The first insulating layer 131 may also comprise dense SiCOH or a porous dielectric having a k value of about 3 or lower, as examples. The first insulating layer 131 may also comprise an ultra-low-k (ULK) material having a k value of about 2.3 or lower, for example. The first insulating layer 131 may comprise a thickness of about 500 nm or less, for example, although alternatively, the first insulating layer 131 may comprise other dimensions.

A plurality of contact plugs is formed within the first insulating layer 131 to couple to various regions of the substrate 110 including the active devices 105. The plurality of contact plugs 111 may be coupled to silicided regions of the substrate 110 as an example.

A first metal level is coupled to the plurality of contact plugs 111 and formed within a second insulating layer 132. The second insulating layer 132 may comprise an inter level dielectric layer and may be suitably selected, for example, as described above for the first insulating layer 131.

A plurality of metal lines is formed within the second insulating layer 132 to form a first metal level M1. The metal lines may include a plurality of layers, for example, a first metal liner 141, a second metal liner 142, and filled with a fill metal 143.

Subsequent layers may be formed using a dual damascene process although in various embodiments a damascene process may also be used. For example, each level with a metal level and a via level comprises a dual-tier opening having an upper conductive line and a lower conductive via. The upper conductive line may be an opening such as a trench (but may also be a hole), and may be filled with a metal. Conductive via may be an opening such as a hole (but may also be a trench) and may be also filled with a metal.

The first via level V1 and the second metal level M2 may be formed within the third insulating layer 133 as a single structure comprising a third metal liner 151, a fourth metal liner 152, and with a second fill metal 153.

Similarly, a second via level V2 and the third metal level M3 may be formed within the fourth insulating layer 134 as a single structure comprising a fifth metal liner 161, a sixth metal liner 162, and with a third fill metal 163.

A plurality of conductive pads 173A, 173B, and 173C are formed over the fourth insulating layer 134. The plurality of conductive pads 173A, 173B, and 173C may be embedded within an insulating layer. A conductive liner 186 may be formed over the plurality of conductive pads 173A, 173B, and 173C, and may comprise a under bump metallization layer 186. The plurality of conductive pads 173A, 173B, and 173C may also include a first metal barrier liner 171 and a seed layer 172 in various embodiments.

In one or more embodiments, the under bump metallization layer 186 may comprise one or more of an etch stop layer, an adhesion layer, a solder metal barrier layer, and a solder metal layer. For example, the etch stop layer may comprise a conductive material such as tungsten, titanium, and titanium tungsten. Similarly, the adhesion layer if present may comprise a titanium layer. The solder metal barrier layer may be configured to prevent the solder metal from diffusion into the conductive pads 173A, 173B, and 173C and also as a solder wettable layer in some embodiments. In some embodiments, the solder metal barrier layer may comprise nickel and vanadium, for example, a NiV alloy layer. In other embodiments, the solder metal barrier layer may comprise other composition including a pure nickel layer.

The solder metal layer may be configured to form a solder with another material being attached. The solder metal layer may comprise silver in one embodiment. In other embodiments, the solder metal layer may comprise other solder materials such as copper, Pb—Sn, and others. Thus, the top surface of the solder metal layer over the conductive pads 173A, 173B, and 173C may provide a surface for forming a solder joint with another substrate.

In one or more embodiments, the plurality of conductive pads 173A, 173B, and 173C may comprise a pure metal, which may include trace impurities, as well as alloys of a metal with another material.

FIGS. 2A-2G illustrates cross-sectional views of a semiconductor device in various stages of processing in accordance with embodiments of the present invention.

Figure 2A:
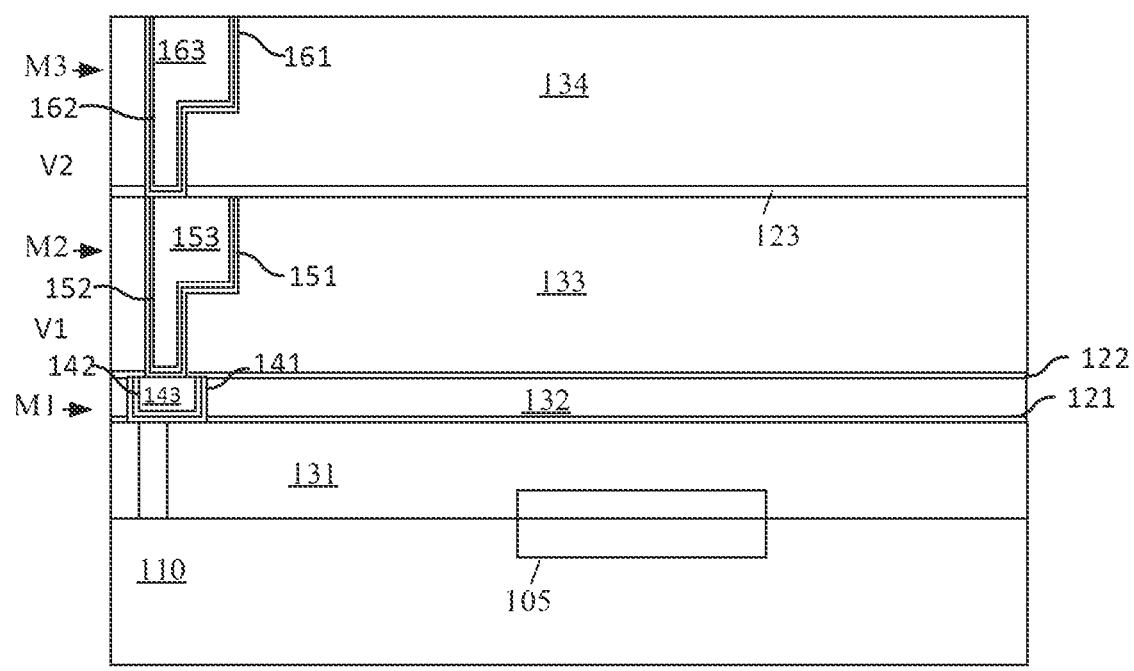
FIGS. 2A-2G illustrates cross-sectional views of a semiconductor device in various stages of processing in accordance with embodiments of the present invention.

Referring to FIG. 2A, the device region 105 is formed over a semiconductor substrate 110. The device region 105 may include a transistor, diode, and other active or passive devices in various embodiments. Contacts are made to the device region 105, which may include forming silicide regions. Next, the device undergoes back end of the line manufacturing, wherein, contacts are made to the semiconductor body and interconnected using metal lines and vias.

As illustrated in FIG. 2A, a first metal level M1 and a first via level V1 are formed over the substrate 110. A first insulating layer 131 is deposited over the substrate 110. In various embodiments, the first metal level M1 and the first via level V1 may be metal levels that are not the lowest metal level and via levels. Other metal levels may be disposed between the first metal level M1 and the substrate 110, for example.

In various embodiments, the first metal level M1 and the first via level V1 may be formed using damascene or dual damascene processes. Further in alternative embodiments, the first metal level M1 and the first via level V1 may be formed using a fill process, and/or silicide process.

A second insulating material layer 132 is then formed over an etch stop liner 121, which is also a diffusion barrier to prevent the metal from diffusing into the dielectric material. The etch stop liner 121 is deposited over the semiconductor body 110. For example, a nitride film (e.g., silicon nitride) is deposited. In various embodiments, such layers may be used to cap the metal lines and may comprise dielectric materials such as silicon nitride (SiN), silicon carbide (SiC), silicon carbo nitrides (SiCN) or other suitable dielectric barrier layers or combinations thereof. In various embodiments, the etch stop liner 121 may comprise an oxide, a nitride, or an oxynitride such as silicon dioxide, silicon nitride, silicon oxynitride, and others. In alternative embodiments, the etch stop liner 121 may comprise boron doped layers includes BPSG, boron nitride, silicon boron nitride, silicon carbon nitride, silicon germanium, germanium, carbon based layers such as amorphous carbon. In further embodiments, the etch stop liner 121 may comprise silicon carbide including SiC:H comprising various combinations of C—H, Si—H, Si—CH$_3$, Si—(CH$_2$)$_n$, and Si—C.

The second insulating material layer 132 comprises insulating materials including inter-level dielectric (ILD) materials, such as SiO$_2$, tetra ethyl oxysilane (TEOS), fluorinated TEOS (FTEOS), doped glass (BPSG, PSG, BSG), organo silicate glass (OSG), fluorinated silicate glass (FSG), spin-on glass (SOG), SiN, SiON, or low k insulating materials, e.g., having a dielectric constant of about 4 or less, or combinations or multiple layers thereof, as examples, although alternatively, the second insulating material layer 132 may comprise other materials. The second insulating material layer 132 may also comprise dense SiCOH or a porous dielectric having a k value of about 3 or lower, as examples. The second insulating material layer 132 may also comprise an ultra-low k (ULK) material having a k value of about 2.3 or lower, for example. The second insulating material layer 132 may comprise a thickness of about 500 nm or less, for example, although alternatively, the second insulating material layer 132 may comprise other dimensions.

Openings for metal lines and vias for the second metallization are formed in the second insulating material layer 132. For example, the second insulating material layer 132 is then etched down to the etch stop liner 121 using standard etch techniques such as a reactive ion etch.

In various embodiments, the metal lines formed in the openings comprise a conductive material and an outer conductive liner to minimize out-diffusion of the conductive material during subsequent thermal processing. The conductive material comprises copper although in some embodiments may comprise aluminum, tungsten, silver, gold, or other conductive materials. The outer conductive liner comprises a diffusion barrier metal such as titanium nitride, titanium, tantalum, tantalum nitride, tungsten nitride, tungsten carbo nitride (WCN), ruthenium or other suitable conductive nitrides or oxides.

A first conductive liner 141 and a second conductive liner 142 may be deposited prior to filling the openings with a conductive fill material 143. The first conductive liner 151 is conformal, and may comprise one or more layers of Ta, TaN, WN, WSi, TiN, Ru, and combinations thereof, as examples. Further examples of materials which may be used for the first conductive liner 151 include tantalum silicon nitride, tungsten, titanium tungsten or the like.

The first conductive liner 141 may be typically used as a barrier layer for preventing metal from diffusing into the underlying semiconductor material or first insulating layer 131. The first conductive liner 141 may be deposited, for example, using a chemical vapor deposition (CVD), physical vapor deposition (PVD) or Atomic layer Deposition (ALD) process.

A second conductive material liner 142 is then deposited similarly using, for example, a CVD, PVD, or ALD process over the first conductive material liner 141. The second conductive material liner 142 may be a seed layer, for example, comprising copper, for subsequent electroplating of copper.

In various embodiments, the first and the second conductive liners 141 and 142 are deposited using a conformal deposition process, leaving a conformal liner or diffusion barrier along the interior walls of openings in the second insulating layer 132. In one embodiment, the first conductive liner 141 comprises tantalum nitride deposited by physical vapor deposition (PVD). Alternatively, the first conductive liner 141 may comprise titanium nitride, tungsten nitride, a refractory metal or other barrier layers that may be conformally deposited, for example, using CVD, PVD processes or electro-less plating. The first conductive liner 141 may comprise a bi-layer of material, including, for example, a barrier layer and a conformal seed layer, which may comprise copper, aluminum, other metals or combinations thereof.

The second conductive material liner 142 may comprise a metallic material. The second conductive material liner 142 may, for example, comprise a pure metal or an alloy. It is understood that any pure metal may include some amount of trace impurities. An alloy may include at least two metallic elements. An alloy may include a metallic element and a non-metallic element. The second conductive material liner 142 may comprise one or more of the elements Cu (copper), Al (aluminum), Au (gold), Ag (silver), and W (tungsten). Examples of materials include pure copper, copper alloy, pure aluminum, aluminum alloy, pure gold, gold alloy, pure silver, silver alloy, pure tungsten and tungsten alloy. The second conductive material liner 142 may be formed by a physical vapor deposition or sputtering process.

A conductive fill material 143 is deposited over the first and the second conductive liners 141 and 142. The conductive fill material comprises a conductive material in various embodiments. The conductive fill material may comprise a metallic material. The conductive fill material may comprise a pure metal or an alloy. The conductive fill material may comprise tungsten in one embodiment, although copper, aluminum, Al—Cu—Si, other metals and combinations thereof may also be used in other embodiments. In various embodiments, the conductive fill material 143 may comprise one or more of the elements Cu (copper), Al (aluminum), Au (gold), Ag (silver), and W (tungsten). Examples of materials include pure copper, copper alloy, pure aluminum, aluminum alloy, pure gold, gold alloy, pure silver, silver alloy, pure tungsten and tungsten alloy. The conductive fill material 143 may be formed by an electroplating (or electrodeposition) process. If the conductive fill material 143 comprises tungsten, preferably a bi-layer seed layer comprising CVD titanium nitride and silicon doped tungsten are used as the first and second conductive liners 141 and 142. In other embodiments, the openings are filled with copper.

Excess portions of the conductive fill material are removed from the top surface of the second insulating layer 132, e.g., using a chemical-mechanical polishing (CMP) process forming the metal lines. The CMP process may also remove any exposed first and the second conductive liners 141 and 142 disposed over the top surface of the second insulating layer 132.

Subsequent metal layers are formed similarly thereby forming the metal lines and vias in the third insulating layer 133 and the fourth insulating layer 134.

Figure 2B:
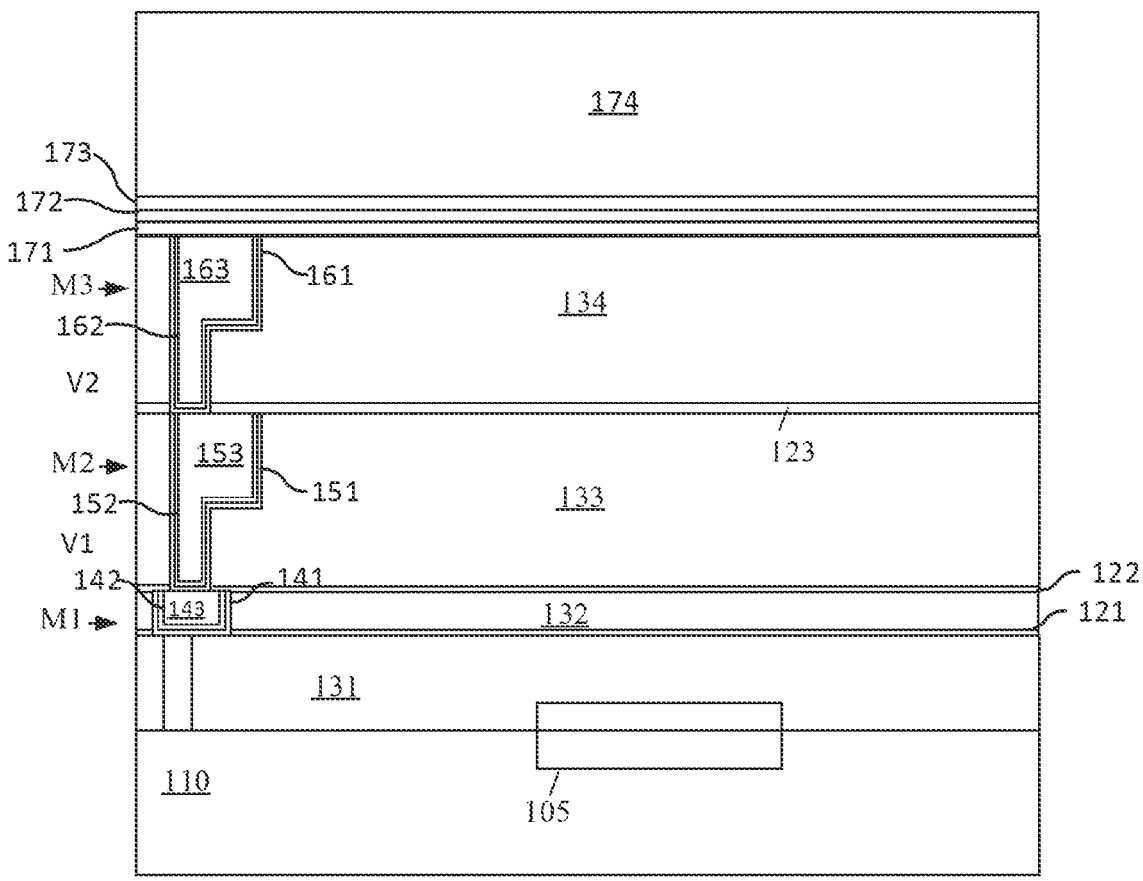

FIG. 2B illustrates a cross-sectional view of a semiconductor device during fabrication after forming the uppermost metallization in accordance with an embodiment of the present invention.

Next, the uppermost metallization layer is fabricated in various embodiments as described further below. The metal lines in the uppermost metallization layer act as landing pads for external contacts, for example, to couple to a circuit board. Because of the large number of transistors or device contacted through a few external contacts, the current passing through the uppermost level metal lines is larger than the lower level metal lines. Consequently, the metal lines in the upper most metallization are thicker than the metal lines in the lower metallization levels. Due to the complexity of fabricating a thick copper line, uppermost levels of conventional devices are fabricated using aluminum lines.

A blanket layer of blanket barrier layer 171 is deposited followed by layers of adhesion promoter layer 172, a seed layer 173 and a copper layer 174. These layers are deposited as blanket layers, i.e., globally over the entire major surface of the wafer or substrate 110. In various embodiments, the blanket barrier layer 171 is a diffusion barrier layer for the copper atoms from the copper layer 173. The blanket barrier layer 171 may comprise titanium, tungsten, TiW, TaN/Ta and others as examples.

In various embodiments, the adhesion promoter layer 172 comprises an aluminum layer. In one embodiment, the adhesion promoter layer 172 comprises a pure aluminum layer. In other embodiments, the adhesion promoter layer 172 comprises alloys of aluminum. In one or more example embodiments, the aluminum layer is an aluminum silicon copper layer comprising aluminum, silicon, and copper. For example, the aluminum layer comprises at least 50% aluminum by atomic percent in one embodiment, and about 95-98% aluminum by atomic percent in various embodiments. In various embodiments, the aluminum layer comprises between 1% to 3% silicon by atomic percent, and 0.1% to 1% copper by atomic percent. In one embodiment, the aluminum layer comprises 2% silicon by atomic percent, and 0.5% copper by atomic percent.

In various embodiments, the adhesion promoter layer 172 is chosen to be a selective etch stop to the overlying seed layer 173 and the copper layer 174. In other words, the adhesion promoter layer 172 is not etched (or etched at a slower rate relative to the copper layer 174) while etching the copper layer 174. Additionally, the adhesion promoter layer 172 provides good adhesion to the overlying seed layer 173 and the copper layer 174 as well as the underlying barrier layer 171. In one or more embodiments, the adhesion promoter layer 172 provides a low ohmic resistance. For example, the specific resistivity of the adhesion promoter layer 172 is less than $10^{-5}$ Ohms $cm^2$.

In one or more embodiments, any element which forms a solid solution with copper, may be used as the adhesion promoter layer 172. For example, in one example, an element may be selected that forms an intermetallic material with copper and with the material of the blanket barrier layer 171. For example, in another example, an element may be selected that forms an alloy with copper and with the material of the blanket barrier layer 171. In one embodiment, the adhesion promoter layer 172 is a solid solution of a majority element and copper. Examples of the majority element include aluminum, tungsten, titanium, nickel, manganese, molybdenum, tantalum, and silicon including amorphous silicon and polysilicon.

In various embodiments, the blanket barrier layer 171 is about 100 nm to about 500 nm in thickness, while the adhesion promoter layer 172 is about 5 nm to about 200 nm in thickness.

The blanket barrier layer 171, the adhesion promoter layer 172, and the seed layer 173 may be formed by sputter deposition in one embodiment.

In other embodiments, other deposition techniques such as chemical vapor deposition may be used to form the seed layer 173. The seed layer 173 comprises a copper layer in one or more embodiments. The seed layer 173 has a thickness of about 20 nm to about 300 nm in various embodiments, and about 50 nm to about 150 nm in one embodiment.

In one or more embodiments, the copper layer 174 is deposited using an electrochemical deposition process. In alternative embodiments, other deposition techniques including electro-less plating, sputtering, and others may be used.

In one or more embodiments, the temperature of the sputtering of the atoms aluminum, copper, and silicon during the formation of the adhesion promoter layer 172 and the sputtering of copper atoms during the formation of the seed layer 173 is controlled to prevent the formation of an intermetallic phase at an interface between the etch stop layer and the power metal layer. In further embodiments, the temperature of the sputtering of the atoms aluminum, copper, and silicon and the sputtering of copper atoms is between 25 to 500° C., and 200° C. to about 400° C. in one embodiment.

The thickness of the copper layer 174 after the electrochemical deposition is about 2 µm to about 15 µm in one or more embodiments, and about 5 µm in one embodiment. The thickness of the copper layer 174 after the electro-chemical deposition is about 10 µm to about 50 µm in one embodiment.

Figure 2C:
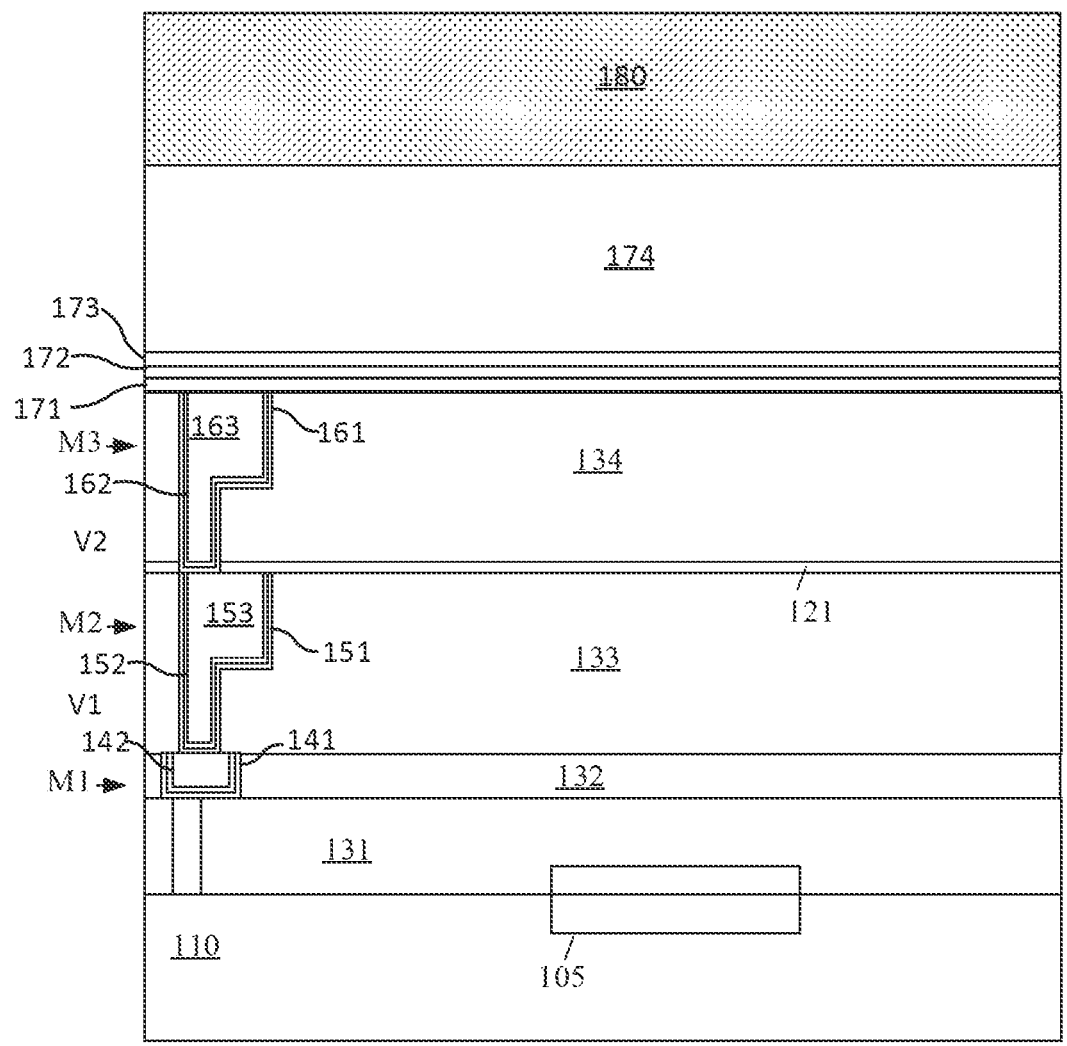

FIG. 2C illustrates a cross-sectional view of a semiconductor device during fabrication after forming a resist layer in accordance with an embodiment of the present invention.

A photo resist layer 180 is formed over the copper layer 174. In one embodiment, the photo resist layer 180 is a negative resist although in other embodiments positive resist may also be used. The photo resist layer 180 is exposed using a lithographic mask and developed so as to form a patterned resist. The patterned resist exposes some regions of the copper layer 174 for forming metal lines by covering the remaining regions of the copper layer 174. The photo resist layer 180 has a thickness of about 5 µm to about 50 µm in various embodiments, and about 5 µm to about 25 µm in one embodiment.

Figure 2D:
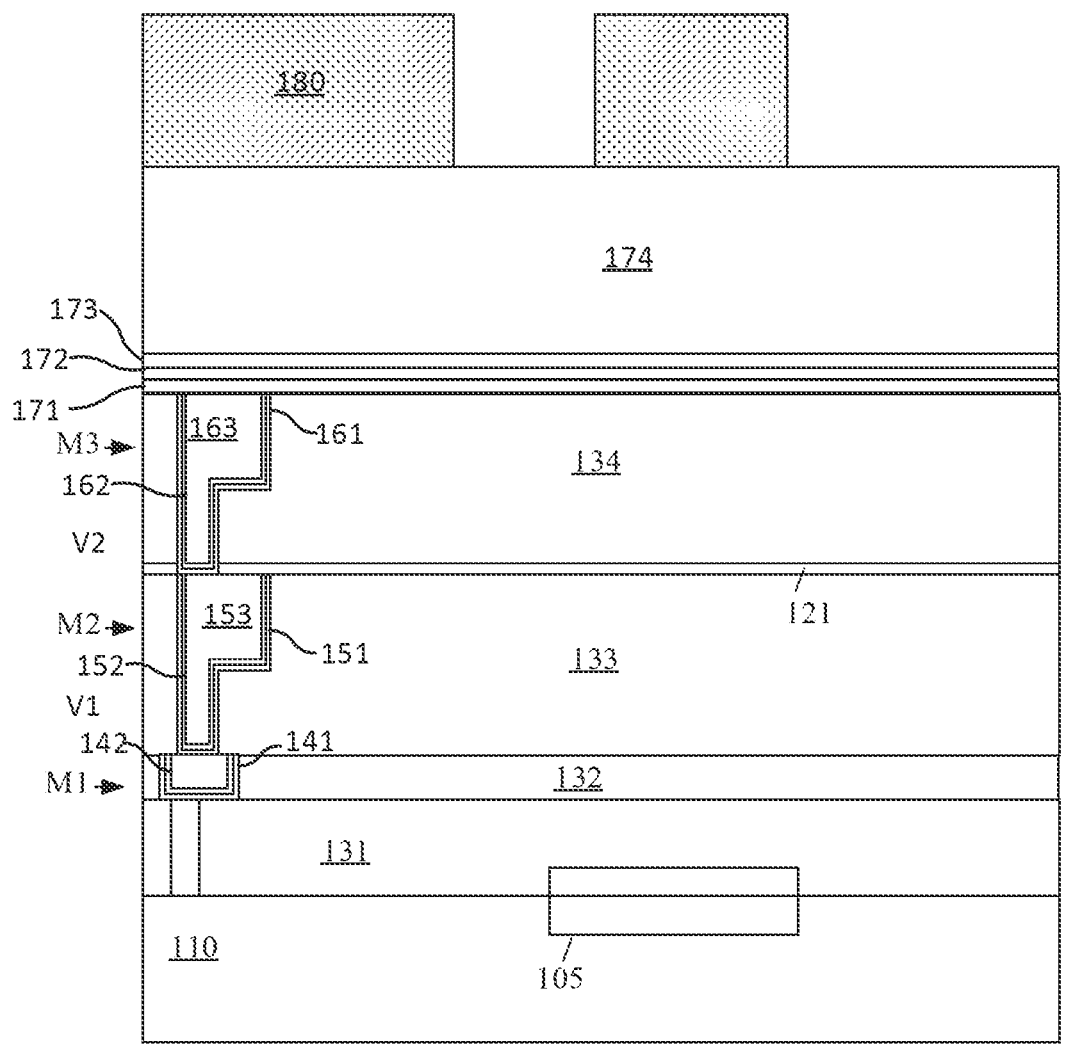

FIG. 2D illustrates a cross-sectional view of a semiconductor device during fabrication after forming a structured resist layer in accordance with an embodiment of the present invention.

The photo resist layer 180 is structured as illustrated in FIG. 2D. In various embodiments, after the development of the photo resist layer 180, an additional plasma treatment may be performed to improve the profile of the developed photo resist layer 180. For example, the plasma treatment may remove resist foots, which may be formed after the development.

Figure 2E:
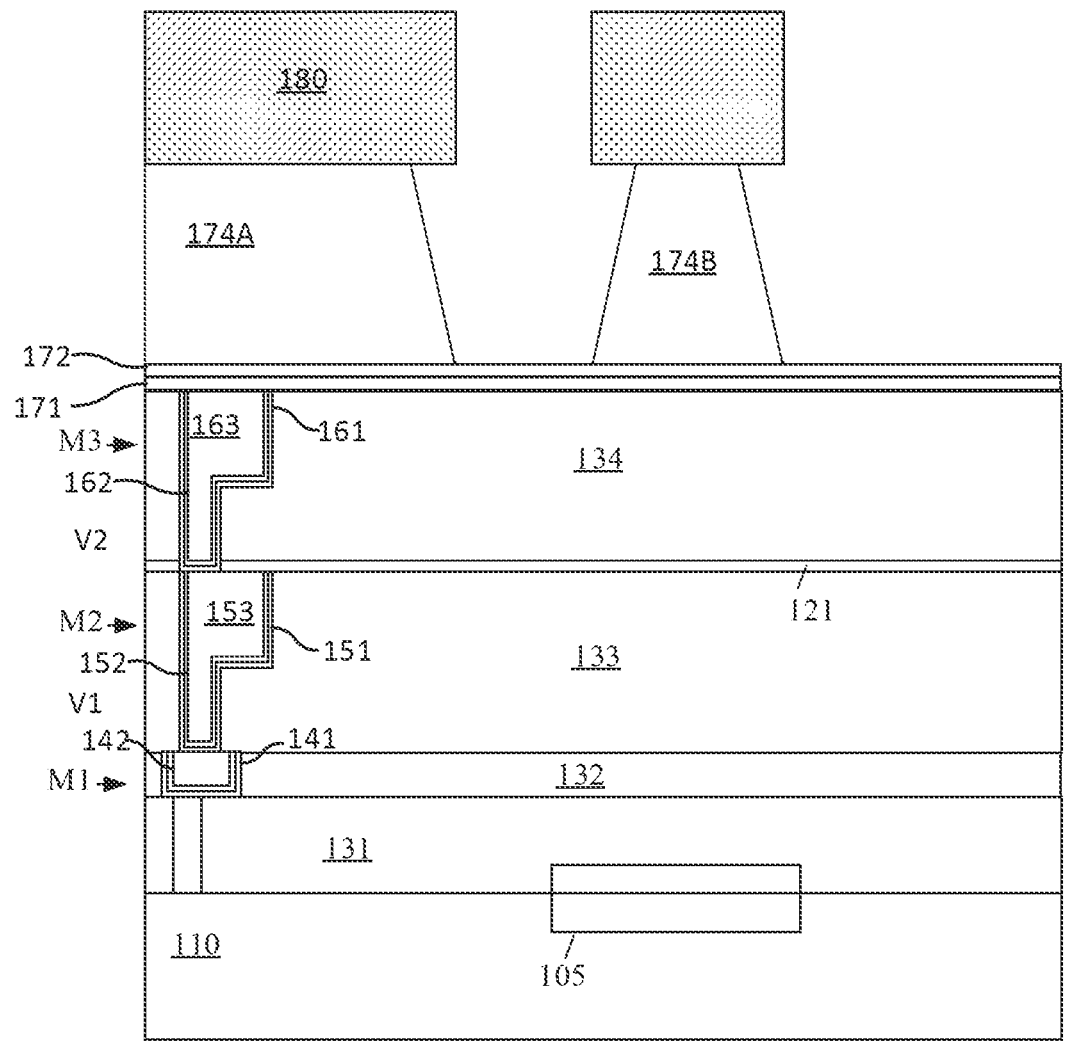

FIG. 2E illustrates a cross-sectional view of a semiconductor device during fabrication after etching the copper layer in accordance with an embodiment of the present invention.

As illustrated in FIG. 2E, using the structured resist layer 180, the copper layer 174 is structured to form patterns such as metal lines or pads 173A, 173B. In various embodiments, the copper layer 174, the seed layer 173, and the adhesion promoter layer 172 are structured simultaneously using a wet chemical etching process.

The lateral undercut of the copper layer 174 underneath the resist layer 180 is a function of the chemistry of the wet chemical etching and the selectivity of the copper layer 174 and the underlying adhesion promoter layer 172.

In various embodiments, the adhesion promoter layer 172 is selected to minimize undercutting of the copper layer 174 and also to reduce the stress of the overall substrate 110 (e.g. as measured by bowing of the substrate 110). Without the adhesion promoter layer 172, patterning of the copper layer 174 results in large variation in pitches (distance between neighboring metal features). For example, while structuring a 10 µm thick copper layer 174, features at multiple critical dimensions (CD), e.g., 5 µm and 15 µm, etch at different rates. At smaller CDs, the wet etch chemistry may reach the surface of the adhesion promoter layer 172 before the copper layer 174 is etched at the larger CD.

In the absence of the adhesion promoter layer 172, once the wet etch chemistry exposes or reaches the surface of the barrier layer 171, the etching proceed laterally more vigorously. The presence of the adhesion promoter layer 172 reduces the vigorous lateral etching of the copper layer 174. In one embodiment, the adhesion promoter layer 172 may reduce the etching rate or even retard the lateral etching of the copper layer 174. In various embodiments, the adhesion promoter layer 172 has a different selectivity from the copper layer 174, for example, the adhesion promoter layer 172 etches at least 50% slower than the copper layer 174, and between 0.01-0.5 times the etch rate of the copper layer 174.

In various embodiments, the adhesion promoter layer 172 comprising aluminum and copper is etched using a wet chemical etching process. In one or more embodiments, the adhesion promoter layer 172 comprising aluminum and copper is etched using a wet chemical etching process comprising other etch chemicals like HF mixtures. In various embodiments, phosphoric acid is the majority component in the wet etch chemistry. Nitric acid and acetic acid are added to improve the viscosity of the phosphoric acid, which is highly viscous. A highly viscous liquid is not preferable because of the difficulty associated with spraying the liquid through the nozzles of a spray tool. Reducing acetic acid increases the etch rate. But the amount of nitric acid, as the oxidizing component for the copper etch, has the most influence on the speed of the reaction. However, too much nitric acid, too much acetic acid and too much water has a bad influence on the adhesion of the resist layer 180 during the etching process. Accordingly, the wet etch chemistry is a compromise and includes phosphoric acid, nitric acid, and acetic acid. As an illustration, the phosphoric acid may be between 50% to 60%, nitric acid may be between 0.1% to 2%, acetic acid may be about 30% to 40% in the etching mixture, which may be further diluted with water.

In various embodiments, a mixture of phosphoric acid, nitric acid and acetic acid may be used to etch the copper layer 174 while a hydrofluoric acid may be used to etch just the intermediate layer 172, which may be AlSiCu in one embodiment.

The underlying reasons for the mechanism of why an adhesion promoter layer 172 comprising aluminum and copper works well (reduced lateral isotropic etching) during copper etching is not understood at this time. In one embodiment, the adhesion promoter layer 172 forms a protective etch resistant coating on the sidewalls of the etched copper layer 174 preventing lateral undercuts. In another embodiment, the adhesion promoter layer 172 removes impurities on the sidewalls of the etched copper layer 174 that increase the uneven etch rates thereby minimizing variations in line edge roughness.

While not limiting to any particular physical mechanism, the inventors postulate that during the deposition of the adhesion promoter layer 172 and the copper layer 174, the aluminum atoms reacts with the copper atoms so as to form a solid solution. The aluminum atoms may preferentially segregate to the grain boundaries of the copper grains limiting the vigorous etching of the copper layer 174 when subsequently exposed to the wet etching chemistry. For example, in some embodiments, the rate of vertical etching may also be reduced as the etching proceed towards the bottom side of the copper layer 174 because of the incorporation of the atoms of the adhesion promoter layer 172. This results in improved control of the etching process leading to uniform profiles of the etched power metal.

Figure 2F:
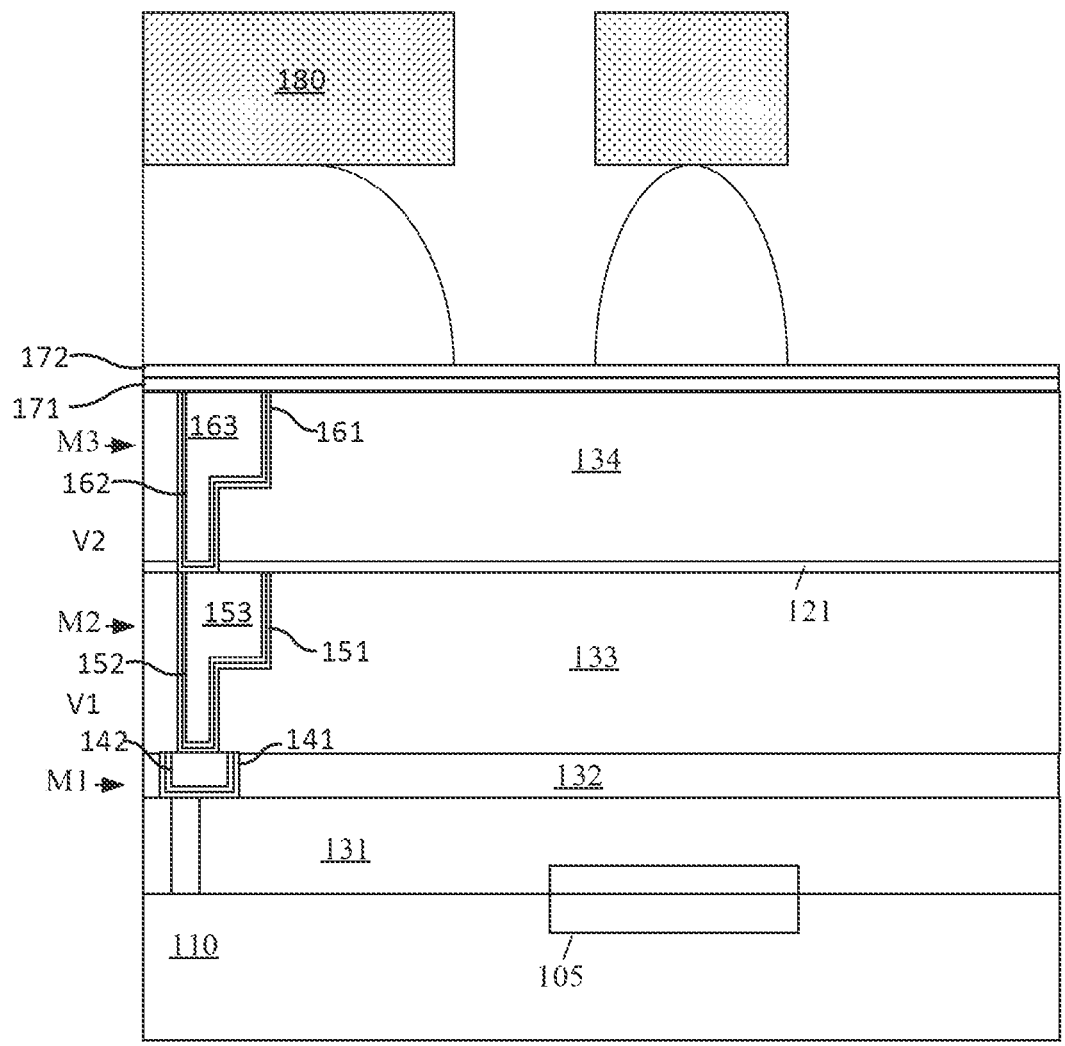

However, in the absence of the adhesion promoter layer 172, the copper layer 174 is etched with increasing rounding as shown in FIG. 2F. Such rounded features can result in process parametric failure and result in yield loss.

Figure 2G:
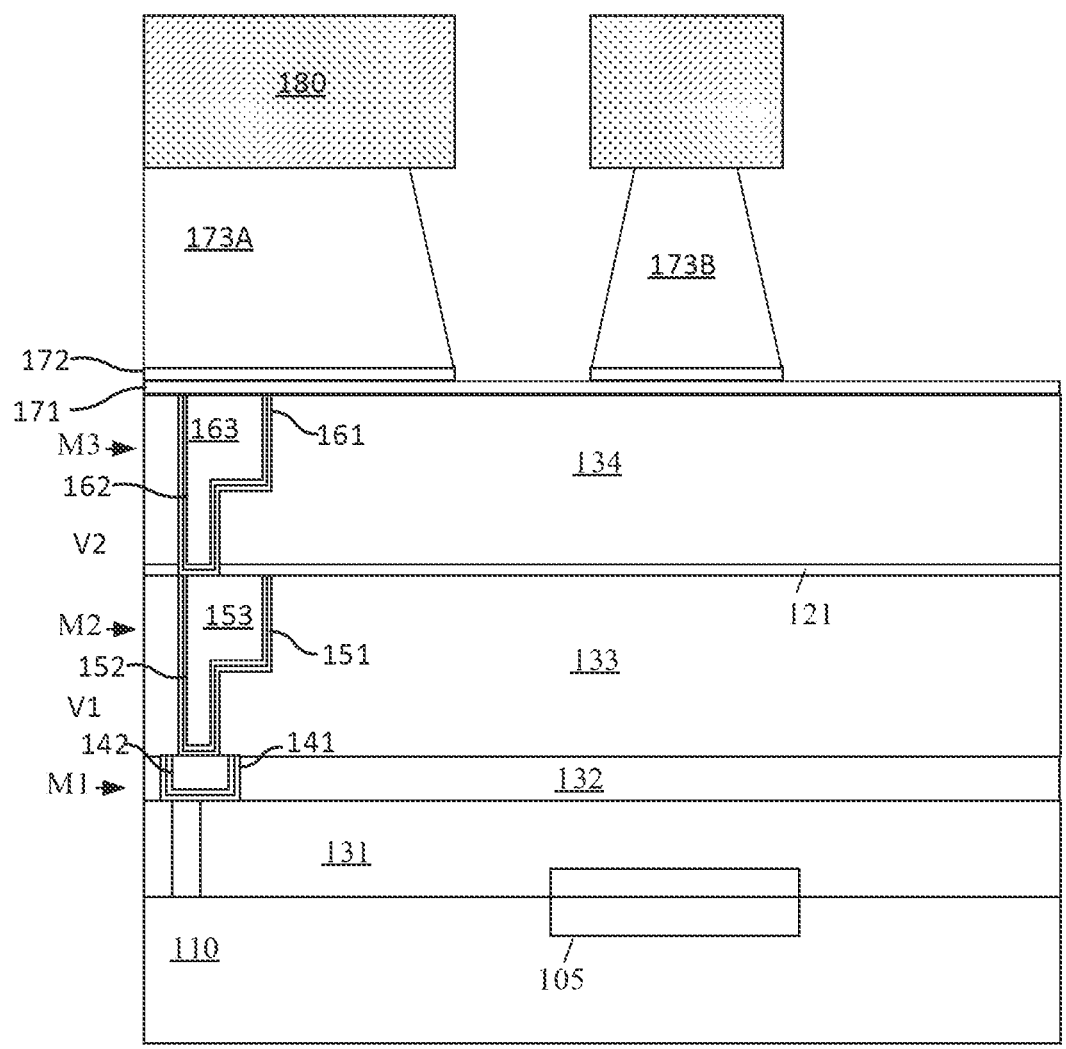

FIG. 2G illustrates a cross-sectional view of a semiconductor device during fabrication after etching the adhesion promotion layer in accordance with an embodiment of the present invention.

Any remaining adhesion promoter layer 172 is removed by continuing the etching process as illustrated in FIG. 2G. Subsequent processing proceeds as in conventional semiconductor processing. For example, a under bump metallization may be formed over the copper layer 174 and a passivation layer may be formed.

Figure 3A:
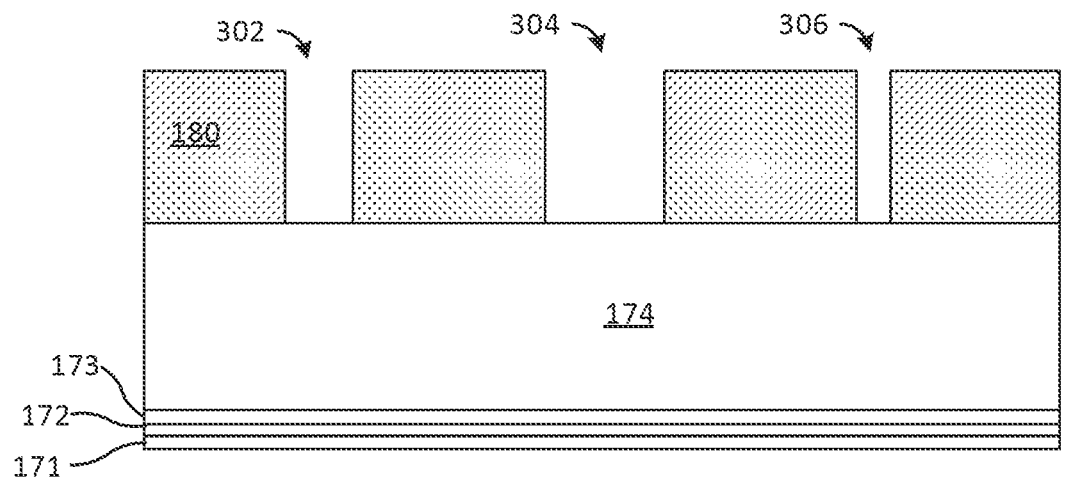
FIGS. 3A and 3B illustrate cross-sectional views of a semiconductor device in various stages of processing in accordance with embodiments of the present invention.
Figure 3B:
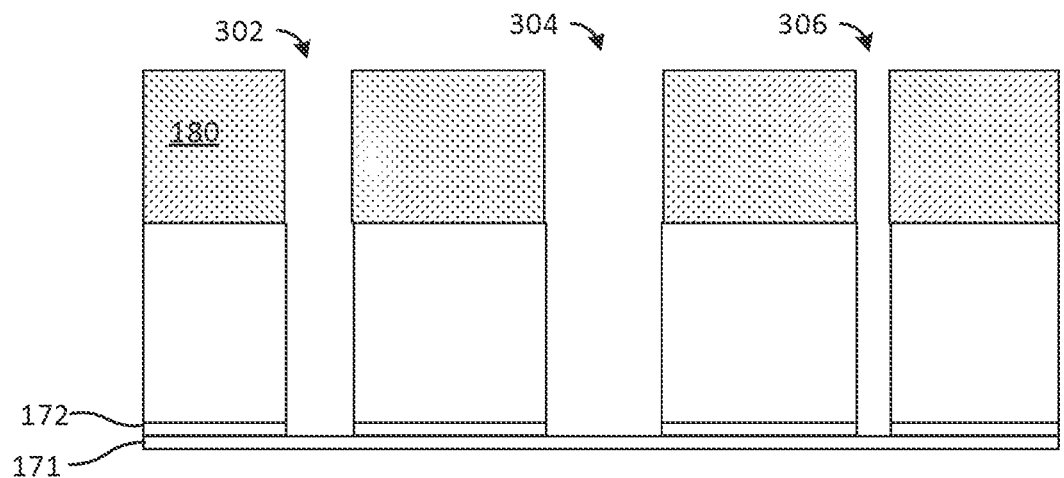

FIGS. 3A and 3B illustrate cross-sectional views of a semiconductor device in various stages of processing in accordance with embodiments of the present invention.

In an alternative embodiment, the embodiments of the present invention may be applied to any structuring of any metal level of a semiconductor device. For illustration, FIG. 3A shows an arbitrary metal level of a semiconductor device prior to structuring by a wet chemical etching process.

FIG. 3A illustrates a blanket barrier layer 171, an adhesion promoter layer 172, a seed layer 173, and a copper layer 174 as described in prior embodiments. The resist layer 180 has been structured to form a plurality of different sized openings, for example, a first opening 302, a second opening 304, and a third opening 306.

Using embodiments of the present invention, the underlying copper layer 174, seed layer 173, adhesion promoter layer 172 are etched without significant lateral etching or resist liftoff whereby profile or the etched power metal & the width of critical dimensions are held to be within permissible limits by using proper adhesion promoter layer 172, which may be an aluminum layer in one example. For example, the variation in critical dimensions of the copper layer 174 between regions having at least 2× variation in pitch (e.g., first region at pitch x and second region with pitch 2x) is less than 10%, and between 1%-10% in one embodiment.

The inventors of this application have found that etching of the copper is drastically and unexpectedly affected by the material as well as the thickness of the underlying intermediate ayer.

FIGS. 4A-4D illustrate cross-sectional views of a semiconductor device in various stages of wafer level processing in accordance with embodiments of the present invention.

Figure 4A:
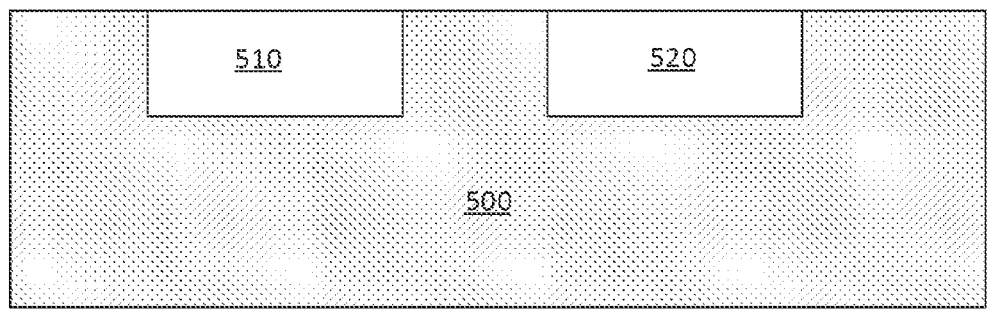
FIGS. 4A-4D illustrate cross-sectional views of a semiconductor device in various stages of wafer level processing in accordance with embodiments of the present invention.

Embodiments of the present invention may be applied using an embedded wafer level processing (WLP) assembly process. In a WLP process, after finishing semiconductor processing, the semiconductor substrate is thinned and diced into individual semiconductor chips. These semiconductor chips are packaged within an encapsulant material and a reconstituted wafer is formed. In the reconstituted wafer, an encapsulant material 500 supports a plurality of semiconductor chips such as first chip 510 and a second chip 520 (FIG. 4A).

Figure 4B:
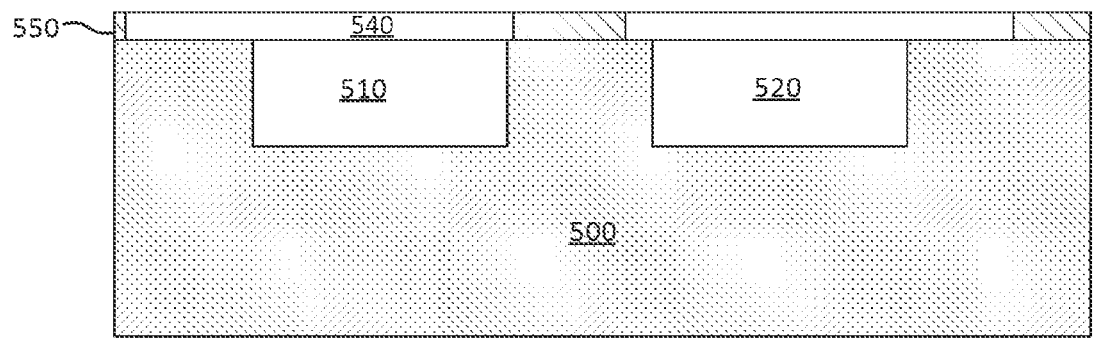
Figure 4C:
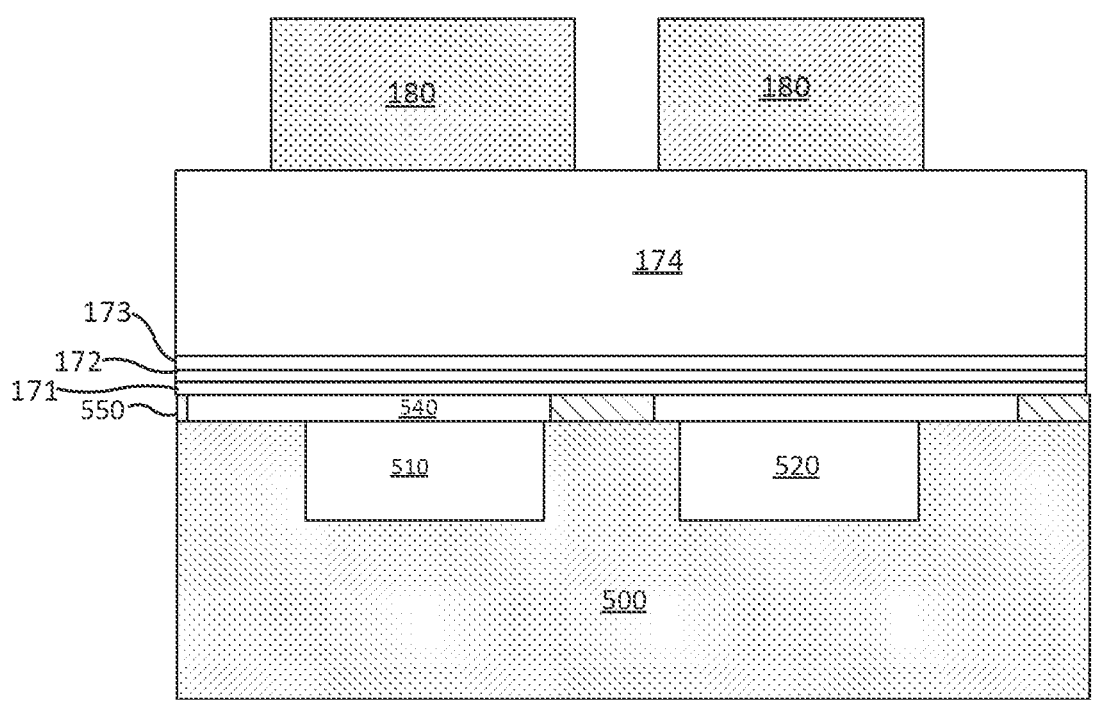
Figure 4D:
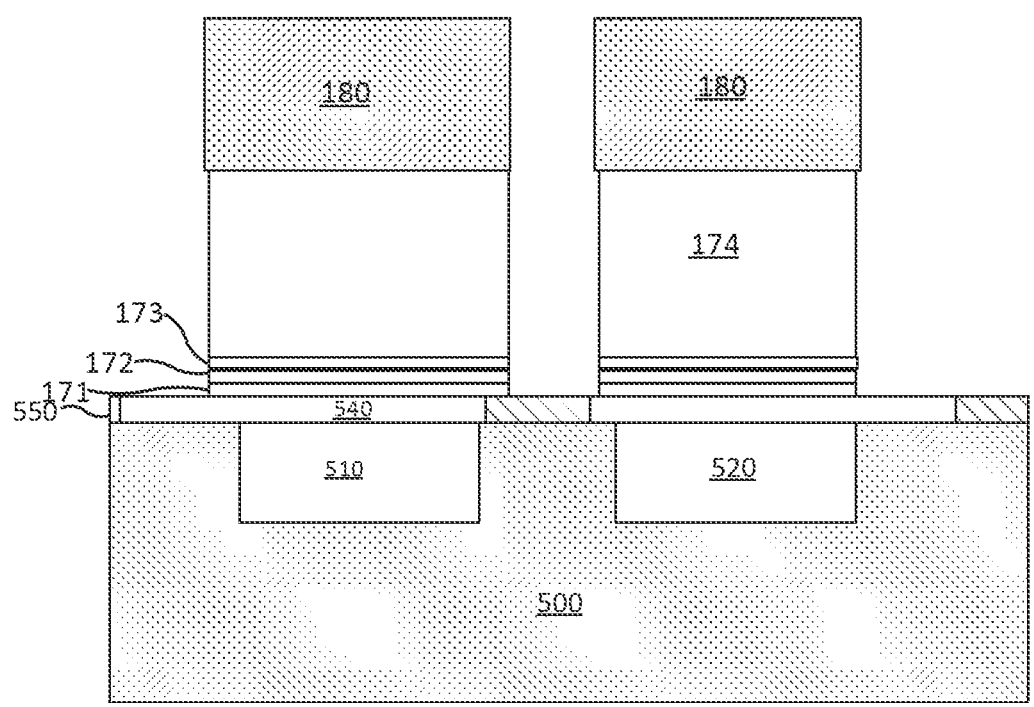

The reconstituted wafer may be processed to form redistribution lines such as metal lines 540 in one or more dielectric layers 550 (FIG. 4B). Referring to FIG. 4C, a blanket layer stack of a barrier layer 171, an adhesion promoter layer 172 including aluminum, copper, and silicon, a seed layer 173, and a copper layer 174 are formed over the redistribution lines 540. A patterned resist layer 180 is formed over the blanket layer stack. Referring to FIG. 4D, the blanket layer stack is etched using a wet etching process as described in various embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-4 may be combined with each other in various embodiments. It is therefore intended that the appended claims encompass any such modifications or embodiments.

What is claimed is:

1. A method of forming a metallization layer over a semiconductor substrate, the method comprising:
    depositing a blanket layer of a diffusion barrier liner over an inter level dielectric layer;
    depositing a blanket layer of an intermediate layer over the diffusion barrier liner;
    depositing a blanket layer of a copper layer over the intermediate layer, wherein the intermediate layer comprises a solid solution of a majority element and copper, wherein the copper layer has a thickness between two microns to fifteen microns;
    after depositing the copper layer, structuring the copper layer, the intermediate layer, and the diffusion barrier liner, wherein the intermediate layer has a different etch selectivity from the copper layer during the structuring of the copper layer using a first wet etch process; and
    forming an under bump metallization layer over the copper layer after the structuring.

2. The method of claim 1, wherein the majority element of the solid solution comprises one or more of aluminum, tungsten, titanium, nickel, manganese, molybdenum, tantalum, and silicon.

3. The method of claim 1, wherein structuring the copper layer, the intermediate layer, and the diffusion barrier liner comprises:
forming an etch mask over the copper layer; and
etching the intermediate layer using a second wet etch process different than the first wet etch process.

4. The method of claim 3, wherein the first wet etch process comprises using a mixture comprising phosphoric acid, nitric acid, and acetic acid, and wherein the second wet etch process comprises using hydrofluoric acid.

5. The method of claim 4, wherein the phosphoric acid is a majority component in the first wet etch process.

6. A method of forming a metallization layer over a semiconductor substrate, the method comprising:
providing a wafer comprising a layer stack comprising a diffusion barrier liner, an intermediate layer comprising aluminum as a majority element, and a copper layer, wherein the copper layer is between ten microns and fifty microns thick;
using wet chemical etching, forming a metal line by etching the copper layer, the intermediate layer, and the diffusion barrier liner; and
forming an under bump metallization layer over the copper layer after the wet chemical etching.

7. The method of claim 6, wherein a chemistry of the wet chemical etching comprises one or more of phosphoric acid, nitric acid, acetic acid, and hydrofluoric acid, wherein the copper layer is etched using a mixture comprising phosphoric acid, nitric acid, and acetic acid, and wherein the intermediate layer is etched using hydrofluoric acid.

8. The method of claim 7, wherein the phosphoric acid is a majority component in the chemistry of the wet chemical etching.

9. The method of claim 6, wherein the intermediate layer is an aluminum layer comprising aluminum and copper.

10. The method of claim 9, wherein the aluminum layer comprises at least 50% aluminum by atomic percent.

11. The method of claim 6, wherein the intermediate layer is an aluminum silicon copper layer comprising aluminum, silicon, and copper.

12. The method of claim 11, wherein the aluminum silicon copper layer comprises at least 50% aluminum by atomic percent.

13. The method of claim 11, wherein the aluminum silicon copper layer comprises between 1% to 3% silicon by atomic percent, and wherein the aluminum silicon copper layer comprises 0.1% to 1% copper by atomic percent.

14. The method of claim 6, wherein the intermediate layer further comprises copper.

15. The method of claim 6, wherein the diffusion barrier liner comprises titanium, titanium nitride, tantalum, tantalum nitride, tungsten, and combinations thereof.

16. A method of forming a metallization layer over a semiconductor substrate, the method comprising:
forming a layer stack comprising a diffusion barrier liner, an intermediate layer, and a copper layer, wherein the copper layer is between ten microns and fifty microns thick; and
forming a metal line by etching the copper layer and the intermediate layer continuously using a wet chemical etching process, wherein the wet chemical etching is selective between the intermediate layer and the copper layer, and wherein the diffusion barrier layer is a diffusion barrier to copper atoms from the copper layer; and
forming an under bump metallization layer over the copper layer after the wet chemical etching process.

17. The method of claim 16, wherein forming the layer stack comprises:
sputtering atoms of aluminum, copper, and silicon to form the intermediate layer followed by sputtering copper atoms to form the copper layer.

18. The method of claim 17, wherein a temperature of the sputtering of the atoms aluminum, copper, and silicon and the sputtering of copper atoms is between 200° C. to about 400° C.

19. The method of claim 16, wherein a chemistry of the wet chemical etching process comprises one or more of phosphoric acid, nitric acid, acetic acid, and hydrofluoric acid, wherein the copper layer is etched using a mixture comprising phosphoric acid, nitric acid, and acetic acid, and wherein the intermediate layer is etched using hydrofluoric acid.

20. A method of forming a metallization layer over a semiconductor substrate, the method comprising:
providing a wafer comprising a layer stack comprising a diffusion barrier liner, an intermediate layer comprising one or more of nickel, manganese, molybdenum, tantalum, and silicon as a majority element, and a copper layer;
using wet chemical etching, forming a metal line by etching the copper layer, the intermediate layer, and the diffusion barrier liner; and
forming an under bump metallization layer over the copper layer after the wet chemical etching.

21. The method of claim 20, wherein the copper layer is between ten microns and fifty microns thick.

* * * * *